(12) United States Patent
Sudo (10) Patent No.: US 9,659,659 B2
(45) Date of Patent: May 23, 2017

(54) SEMICONDUCTOR MEMORY APPARATUS AND DATA SCRAMBLING METHOD USING THE SAME

(71) Applicant: Winbond Electronics Corp., Taichung (TW)

(72) Inventor: Naoaki Sudo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/989,785

(22) Filed: Jan. 6, 2016

(65) Prior Publication Data
US 2016/0284411 A1    Sep. 29, 2016

(30) Foreign Application Priority Data
Mar. 27, 2015    (JP) .................................. 2015-065425

(51) Int. Cl.
| | | |
|---|---|---|
| *G11C 11/34* | (2006.01) | |
| *G11C 16/10* | (2006.01) | |
| *G11C 16/04* | (2006.01) | |
| *G11C 16/26* | (2006.01) | |
| *G11C 7/10*  | (2006.01) | |
| *G11C 16/34* | (2006.01) | |

(52) U.S. Cl.
CPC ............ *G11C 16/10* (2013.01); *G11C 7/1006* (2013.01); *G11C 16/0483* (2013.01); *G11C 16/26* (2013.01); *G11C 16/3427* (2013.01)

(58) Field of Classification Search
None
See application file for complete search history.

(56) References Cited

U.S. PATENT DOCUMENTS

| | | | | |
|---|---|---|---|---|
| 2009/0067244 | A1* | 3/2009 | Li ........................ | G11C 7/1006 |
| | | | | 365/185.12 |
| 2013/0246710 | A1* | 9/2013 | Deguchi ............. | G06F 11/2074 |
| | | | | 711/129 |
| 2014/0269071 | A1* | 9/2014 | Pandya .................. | G11C 16/10 |
| | | | | 365/185.11 |

FOREIGN PATENT DOCUMENTS

JP    2008198299    8/2008

\* cited by examiner

*Primary Examiner* — Harry W Byrne
*Assistant Examiner* — Sultana Begum
(74) *Attorney, Agent, or Firm* — Jianq Chyun IP Office

(57) ABSTRACT

A semiconductor memory apparatus and a data processing method are provided. The semiconductor memory apparatus gives consideration to partial page programming and data scrambling, and improves the reliability. In the flash memory of the present invention, when data is programmed to a page n times consecutively, identification information and program information are generated. A scrambled data, the location information and the flag information are programmed to a selected page in a memory array. The location information indicates a storage location for a data scrambling in the page selected based on an input address information. The flag information is used to identify a storage region specified by the location information is programmed.

19 Claims, 7 Drawing Sheets

Management Information

| Partial Data | Storage Region | Starting Address | Ending Address | Flag |
|---|---|---|---|---|
| D1 | P1 | 000h | 0FFh | "0" |
| D2 | P2 | 100h | 1FFh | "0" |
| D3 | P3 | 200h | 3FFh | "0" |
| D4 | P4 | 400h | 7FFh | "1" |

| | Erase | Write-In | Read-Out |
|---|---|---|---|
| Selected W/L | 0 | 15~20V | 0 |
| Non Selected W/L | F | 10V | 4.5 |
| SGD | F | Vcc | 4.5 |
| SGS | F | 0 | 4.5 |
| SL | F | Vcc | 0 |
| P-Well | 21 | 0 | 0 |

Management Information

| Partial Data | Storage Region | Starting Address | Ending Address | Flag |
|---|---|---|---|---|
| D1 | P1 | 000h | 0FFh | "0" |
| D2 | P2 | 100h | 1FFh | "0" |
| D3 | P3 | 200h | 3FFh | "0" |
| D4 | P4 | 400h | 7FFh | "1" |

FIG. 6

Program of Partial Data D1

FIG. 7A

Program of Partial Data D2

FIG. 7B

Program of Partial Data D3

FIG. 7C

Program of Partial Data D4

FIG. 7D

Program State of Selected Page

SEMICONDUCTOR MEMORY APPARATUS AND DATA SCRAMBLING METHOD USING THE SAME

CROSS-REFERENCE TO RELATED APPLICATION

This application claims the priority benefit of Japan application serial no. 2015-065425, filed on Mar. 27, 2015. The entirety of the above-mentioned patent application is hereby incorporated by reference herein and made a part of this specification.

BACKGROUND OF THE INVENTION

Field of the Invention

The invention relates to a Not AND (NAND) type flash memory and such semiconductor memory device, and relates particularly to a data scrambling method of a NAND type flash memory.

Description of Related Art

A NAND type flash storage has a memory array which includes a plurality of blocks, wherein a NAND string constructed by a plurality of storage cells connected in series is formed in one block. Typically, a read-out or programming of data is performed with one page as the unit, and erasing of data is performed with one block as the unit.

Patent document one discloses a data writing method by which reliability of operation for a NAND type flash memory may be improved. The writing method is: selecting a scrambling method based on the address of a word line, scrambling the data to be written according to the selected scrambling method, and writing the scrambled data to the corresponding page.

The storage cells of the NAND type flash memory includes an N-type metal oxide semiconductor (MOS) structure, wherein the N-type MOS structure has a floating gate (charge accumulation layer) and a control gate. When electrons accumulate at the floating gate, the threshold value of the storage cell shifts to the positive direction, wherein this state is data "0". On the other hand, when electrons are discharged from the floating gate, the threshold value shifts to the negative direction, wherein this state is data "1". When the blocks are erased in a batch, all of the memory cells in the blocks are data "1".

In this kind of flash memory, when programming (write-in) or erasing is repeated, the reliability of the stored data deteriorates. For example, a situation where a ratio of data "0" is overwhelmingly more than data "1" or the opposite situation when a ratio of data "1" is overwhelmingly more than data "0" when programming is performed. Due to miniaturization and high integration of memory cells and the distance between memory cells becoming shorter, adjacent memory cells may be in a capacitive coupling situation and interfere with each other. When the storage cells around the periphery of one storage cell are all data "0", then the memory cell at the center is influenced by the memory cells of the periphery and has a higher threshold value than compared to a case when they are all data "1". Furthermore, the uneven distribution of data "0" or data "1" may have an adverse effect on the characteristics of the sense amplifier when data is read-out due to a difference in the floating voltage of the source line voltage.

Therefore, from a reliability perspective, an ideal ratio of data "0" to data "1" is approximately 0.5. One method for implementing this ratio is a data scrambling scheme. Namely, random numbers are used to scramble the data to be programmed, and then the scrambled data is programmed to the memory array. Regarding scrambling, for example, the programming addresses may be used as seeds such that the random number may be changed for every address. In this way, data "0" and data "1" may be disposed randomly in the column direction and the row direction of the memory array. In addition, during read-out operation, the scrambled data is converted to the original data by using the random number that was used in scrambling to descramble the data that is read-out by the memory array.

In the NAND type flash memory, the memory cell after data is erased is data "1", and the read-out operation after erasing, for example, is required to output data "FFh". Therefore, under the condition when data scrambling is used in the NAND type flash memory, descrambling needs to be restricted such that the data after erasing are all "1". On the other hand, there are times where the data that is programmed by data scrambling are all "1", even though the probability is very small. Under the situation where this type of data is read-out, descrambling is required to be performed. Due to this type of limitation, a flag bit is provided in a redundant region of the NAND type flash memory for determining whether the page is in an erased state or in a programmed state. The flag bit is data "1" when a block including the page is erased, and is changed to data "0" when the page is programmed.

Figure 1A:
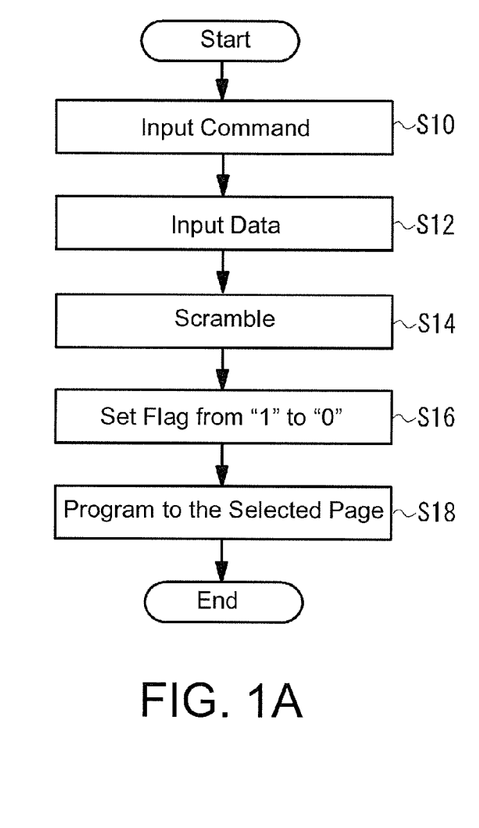
FIG. 1A and FIG. 1B show operation flows of a NAND type flash memory performing data scrambling.

FIG. 1A is a flow of a programming operation and FIG. 1B is a flow of a read-out operation. First, in a programming operation, a programming command is received from an external controller (S10). Then, the address and the data to be programmed are received (S12). Scrambling is performed on the data received (S14). Furthermore, the flag of data "1" is changed to "0", so as to show the selected page has already been programmed (S16). Next, the scrambled data and the flag are programmed to the selected page (S18).

Figure 1B:
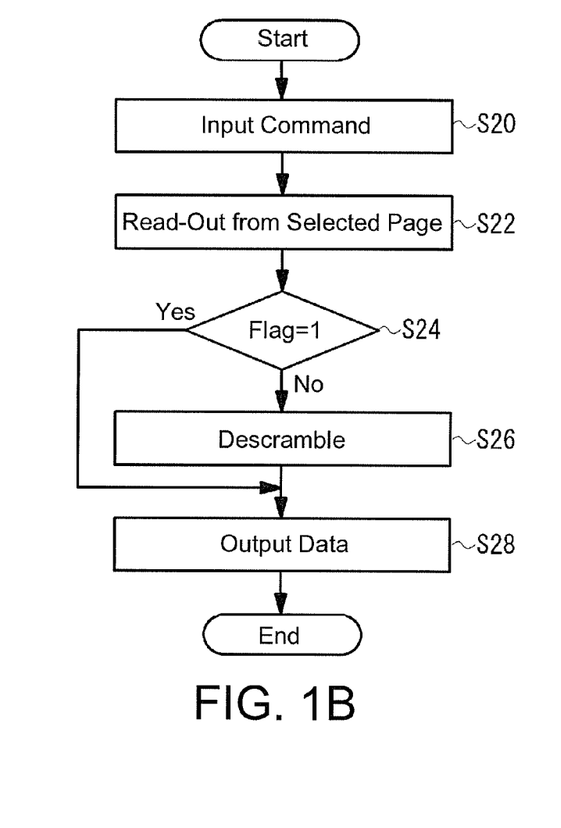

In the read-out operation, when a read-out command and address are inputted from the external controller (S20), data is read-out from the selected page of the memory array (S22). Next, determination of the flag is performed (S24). If the flag is "0", the data that is read-out is descrambled (S26), and converted to the original data and outputted (S28) even if all the data are "1" since that data is programmed data. On the other hand, if the flag is "1", then the data that is read-out is data after erasing, therefore descrambling is not performed and the data is outputted directly (S28).

Here, in the NAND type flash memory, a function (referred to as partial page programming for convenience below) for programming data on a same page n number of times consecutively may be executed (n is a natural number greater than or equal to 2). When high integration further advances, the size of one page increases and there are situations where the amount of data being programmed is less than the size of one page. If data can be programmed only once on the same page, the usage efficiency of each page decreases. Conversely, if a plurality of data is programmable on one page, those data must be programmed on a plurality of pages, then the time required for the program increases significantly. On the other hand, programming data on the same page n number of times consecutively means that a high programming voltage that will be applied to the page n number of times, so the number of times of programming is limited. For example, if n=4, then data can be programmed to the same page 4 times consecutively. Hereinafter, the data programmed to the same page by partial page programming is referred to as partial data.

In partial page programming, for example, a program command is received from the external controller; then the column address Ax and the row address Ay1 are received; then a partial data D1 is received; then when a finish command is received, programming of the partial data is started. That is to say, the partial data D1 is programmed to the page selected by the column address Ax starting from the row address Ay1. During this period, the NAND flash memory outputs a busy signal to the external controller such that access is restricted. At the point when access restriction is lifted, the ready signal is outputted to the external controller. When the external controller receives the ready signal, in order to program the next partial data, similar to the above, a program command, a row address Ay2, a partial data D2 and a finish command are sent to the NAND flash memory, and the NAND flash memory programs a partial data D2 to the same selected page starting at the row address Ay2. This type of process is repeated n number of times and as a result, n number of partial data D1, D2, . . . , Dn are programmed on one page.

In the NAND type flash memory which may execute this type of partial page programming, in the case when the data scrambling scheme is adopted, it must be determined whether the partial data in the page was programmed or was deleted. Since the size of the partial data programmed by partial page programming is not fixed but variable, data scrambling can not be properly executed without determining the boundaries of the partial data.

SUMMARY OF THE INVENTION

An objective of the invention is to solve this type of problem, and provides an implementation for partial page programming and data scrambling. In addition, the reliability of the semiconductor memory device is increased.

The data processing method for a semiconductor memory device that includes a NAND type memory array having a plurality of memory cells connected in series, the data processing method of the invention includes a generating step, generating identification information and program information when programming data to a same page of the memory array n times consecutively, wherein the identification information identifies a storage region when the data is programmed to the page selected according to inputted address information, and the program information shows whether or not the storage region is a programmed region, and n is a natural number greater than or equal to 2. A scrambling step, scrambling the data. And a programming step, programming the scrambled data, the identification information and the program information to the selected page.

A semiconductor memory device of the invention includes a NAND type memory array, formed by a plurality of memory cells connected in series. A selecting component, selecting a page of the memory array according to inputted address information. A generating component, generating identification information and program information when programming data to the same page of the memory array n times consecutively, wherein the identification information identifies a storage region where the inputted data is programmed to the page selected by the selecting component, and the program information shows whether or not the storage region is a programmed region, and n is a natural number greater than or equal to 2. A scrambling component, scrambling the inputted data to be programmed. And a programming component, programming the scrambled data, the identification information and the program information to the page selected by the selecting component.

According to the invention, identification information identifying a storage region and the program information of that storage region when the data is programmed are generated when data is programmed to the same page n times consecutively, and this information is stored together with the scrambled data, therefore data may be suitably scrambled even when partial page programming is executed, and a reduction in reliability may be prevented.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A is a flow of a programming operation and FIG. 1B is a flow of a read-out operation.

FIG. 8A is a flow of a programming operation and FIG. 8B is a flow of a read-out operation.

DESCRIPTION OF THE EMBODIMENTS

Below, reference will be made to the figures to describe embodiments of the invention in detail. In addition, it should be noted, the figures are not in the same scale with the actual device and each part is illustrated with emphasis for easier understanding.

Figure 2:
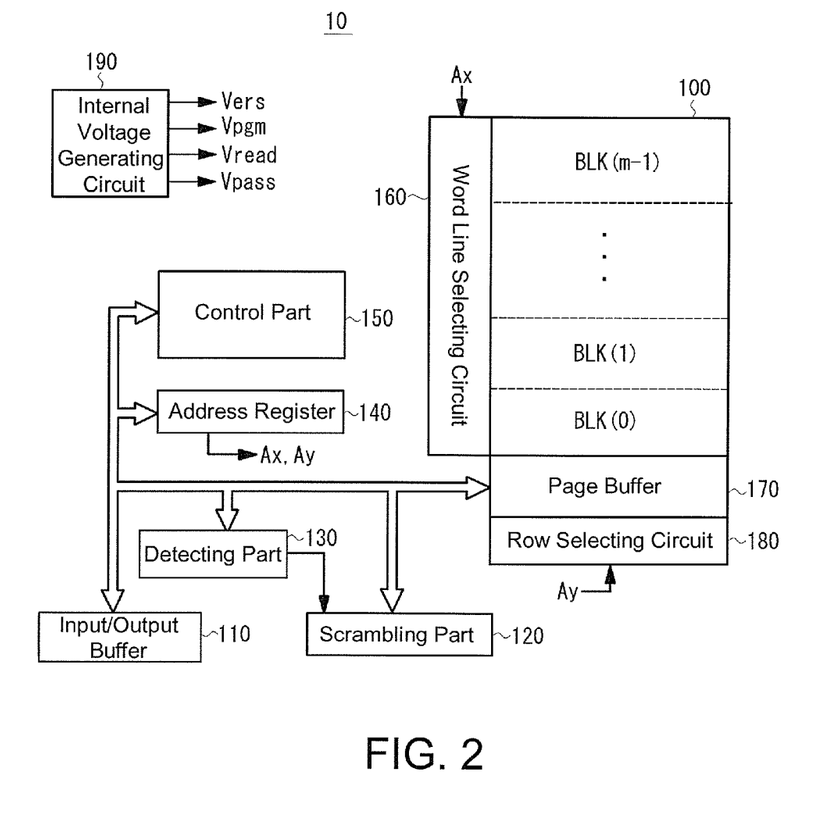
FIG. 2 is a diagram showing an overall schematic structure of a NAND type flash memory according to an embodiment of the invention.

FIG. 2 shows a typical structure of a flash memory according to an embodiment of the invention. However, the structure of the flash memory shown here is only an example and the invention is not limited to this type of structure. A flash memory 10 of the embodiment is constructed by including: a memory array 100, with a plurality of memory cells aligned in a matrix shape; an input/output buffer 110 connected to an external input/output terminal I/O and holds input/output data; a scrambling part 120, scrambling data to be programmed to the memory array 100 or descrambling data that is read-out from the memory array 100; a detecting part 130, monitoring data inputted to a page buffer 170 from the external input/output terminal or the input/output buffer, and detecting the number of times and size of the inputted data; an address register 140, receiving address data from the input/output buffer 110; a control part 150, receiving command data from the input/output buffer 110 or control signals from external parts and controlling each part; a word line selecting circuit 160, receiving column address information Ax from the address register 140, decoding the column address information Ax, and selecting the block and selecting the word line and such according to the decoded result; a page buffer 170, holding data that is read-out from the selected page through the word line selecting circuit 160, and holding write-in data to the selected page; a row selecting circuit 180, receiving row address information Ay from the address register 140, decoding the row address information Ay, and selecting the data in the page buffer 170 according to the decoded result; and an internal voltage generating circuit 190, generating various voltages (write-in voltage Vpgm, pass voltage Vpass, read-out pass voltage Vread, erase voltage Vers and such) required such as for data read-out, programming and erasing.

The memory array 100 has m number of memory blocks BLK(0) BLK(1), . . . , BLK(m−1) disposed in the row direction. The page buffer 170 is disposed near the block BLK(0). In addition to this type of configuration, the page buffer 170 may also be disposed at the other end part of the block or be disposed on the end parts of both sides.

Figure 3:
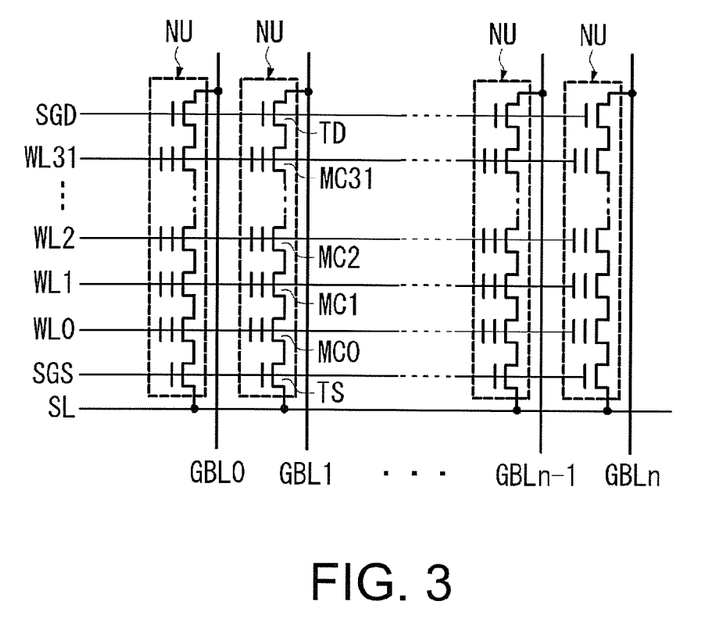
FIG. 3 is a circuit diagram showing a structure of a NAND string of a memory array according to an embodiment of the invention.

In one memory block, as shown in FIG. 3, a plurality of NAND string units NU are formed. The NAND string units NU are formed by connecting a plurality of memory cells in series. In one memory block, n+1 number of NAND string units NU are aligned along the column direction. The NAND string units NU include a plurality of memory cells MCi (i=0, 1, . . . , 31) connected in series, a selecting transistor TD connected with one of the end parts (namely the drain side of the memory cell MC31), and a selecting transistor TS connected with another end part (namely the source side of the memory cell MC0), wherein the drain of the selecting transistor TD is connected to one of the corresponding bit lines GBL (GBL0 to GBLn) and the source of the selecting transistor TS is connected to a common source line SL.

The gate of the memory cell MCi is connected to the word line WLi, and the gates of the selecting transistors TD and TS are connected to the selecting gate lines SGD and SGS which are parallel with the word line WL. The word line selecting circuit 160 selectively drives the selecting transistors TD and TS through the selecting gate signals SGS and SGD of the block when selecting a block according to the column address Ax or the converted address. FIG. 3 shows a structure of a typical NAND string unit NU, however the NAND string unit NU may also include one or a plurality of dummy cells.

A memory cell typically has a MOS structure, wherein the MOS structure includes a source/drain of an N-type diffusion region formed in a P-well; a tunnel oxide layer formed on a channel between the source/drain; a floating gate formed on the tunnel oxide layer; and a control gate formed on the floating gate through a dielectric layer. When charges are not accumulated at the floating gate, namely when data "1" is written-in, the threshold value is a negative state and the memory cell is normally on. When charges accumulate at the floating gate, namely data "0" is written-in, the threshold value shifts to the positive and the memory cell is normally off. Wherein, the memory cell may be a single level cell (SLC) type storing one bit (binary data) or may be a multi level cell (MLC) type storing a plurality of bits.

Figure 4:
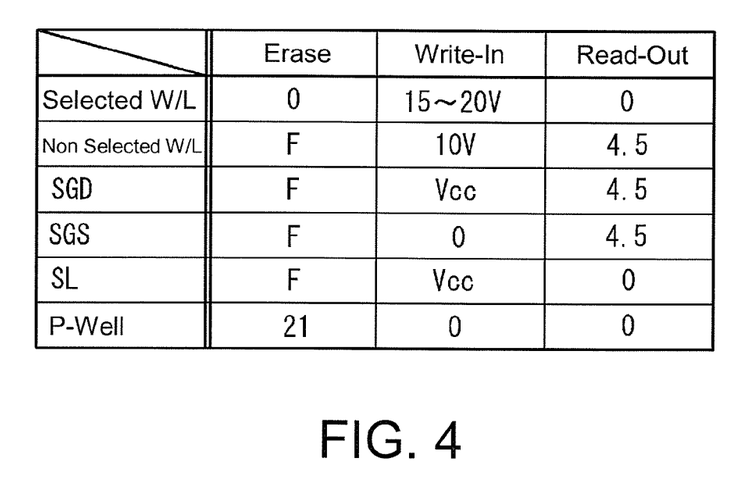
FIG. 4 is a diagram showing an example of voltages applied to each part when a flash memory is programmed according to an embodiment of the invention.

FIG. 4 is a table showing an example of bias voltages applied to the flash memory for each operation. During a read-out operation, a certain positive voltage is applied to the bit line, a certain voltage (for example, 0V) is applied to the selected word line, the pass voltage Vpass (for example, 4.5V) is applied to the non-selected word line, a positive voltage (for example 4.5V) is applied to the selecting gate lines SGD and SGS, the bit line selecting transistor TD and the source line selecting transistor TS are turned on, and 0V is applied to the common source line. During a programming (write-in) operation, a high voltage of the programming voltage Vpgm (for example, 15~20V) is applied to the selected word line, a middle voltage (for example, 10V) is applied to the non-selected word line, the bit line selecting transistor TD is turned on, the source line selecting transistor TS is turned off, and a potential corresponding to data "0" or "1" is supplied to the bit line GBL. In the erasing operation, 0V is applied to the selected word line in the block, a high voltage (for example, 20V) is applied to the P-well, and electrons of the floating gate are drawn out to the substrate, so as to erase data in a block unit.

Figure 5:
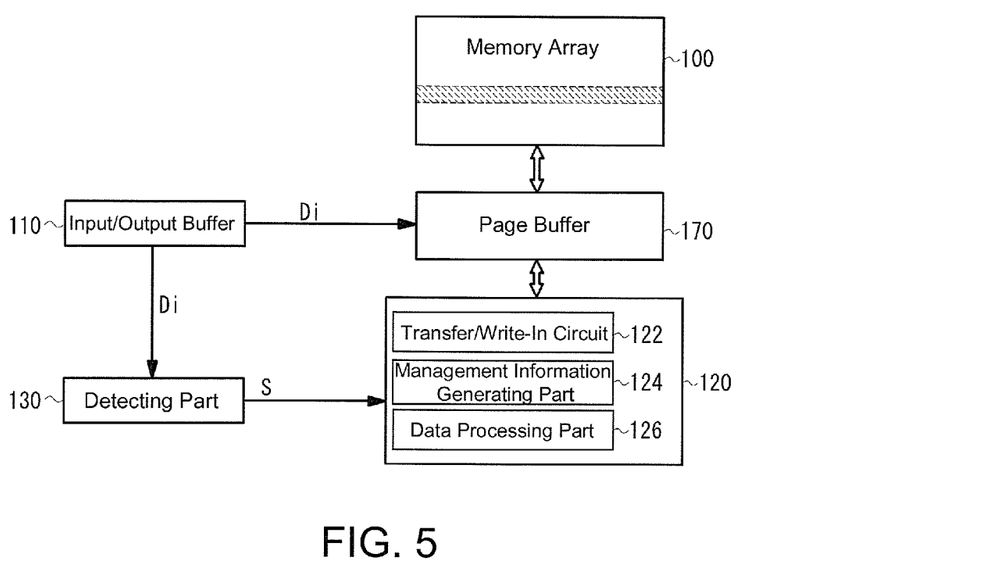
FIG. 5 is a diagram showing a flow of the data inputted to the flash memory according to an embodiment of the invention.

Next, referring to FIG. 5, details regarding the scrambling part 120 and the detecting part 130 of the flash memory 10 will be described. The partial data Di inputted from the input/output buffer 110 is loaded to the page buffer 170 and the partial data Di is also inputted to the detecting part 130 at the same time. The detecting part 130 detects the storage region where the partial data Di is to be programmed when partial page programming is executed. Preferably, the detecting part 130 detects the size of the partial data Di and calculates the row address of the storage region where the partial data Di is to be programmed from the detected result. For example, the detecting part 130 includes a counter which counts the number of bits of the partial data Di and the size of the partial data Di is detected from the counted result. Furthermore, the detecting part 130 detects a number times of when the partial data Di was inputted as data in partial page programming. The number of times the partial data Di is inputted is also counted by the counter. The detection result S of the detecting part 130 is provided to the scrambling part 120, the control part 150 and such. The scrambling part 120 is constructed by including a transfer/write-in circuit 122, a management information generating part 124, and a data processing part 126.

The transfer/write-in circuit 122 transfers the partial data Di held in the page buffer 170 to the data processing part 126 or transfers the data processed at the data processing part 126 to the page buffer 170. In addition, the transfer/write-in circuit 122 writes management information of the partial data that is generated by the management information generating part 124 to the spare region of the page buffer 170.

Figure 6:
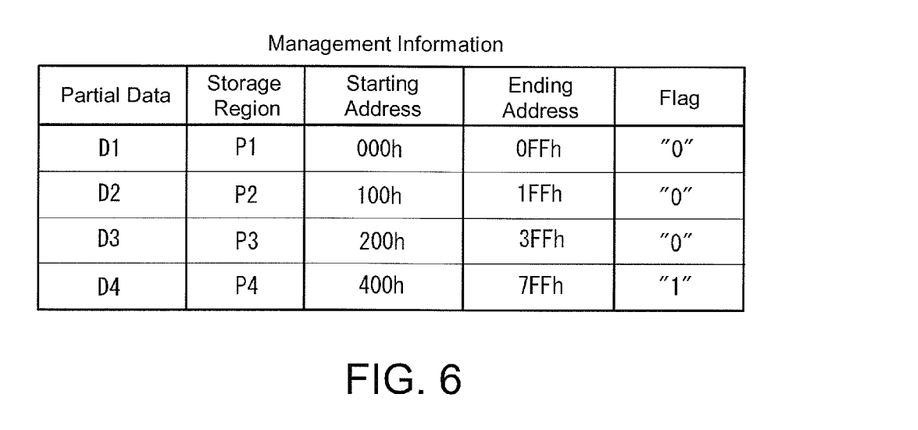
FIG. 6 is a diagram showing management information that is generated relating to each partial data when partial page programming is executed according to an embodiment of the invention.

The management infatuation generating part 124 generates the management information of the partial data according to the detection result S of the detecting part 130. FIG. 6 shows an example of management information generated by the management information generating part 124. FIG. 6 shows a state at a point when programming of the partial data D1, D2, D3 and D4 on a same page is completed up until the partial data D4 by partial page programming. First, when the partial data D1 of first time is inputted, the detecting part 130 detects the input sequence and size of the partial data D1, and this detection result is provided to the management information generating part 124. The management information generating part 124 generates the management information of the partial data D1 according to the detection result. In this example, a starting address and a stopping address of the storage region P1 are generated in order to distinguish the storage region P1 storing the partial data D1. In addition, the flag is changed from "1" to "0" to show that the storage region P1 is a programmed region. Similarly, when the partial data D2 of second time is inputted, the input sequence and size of the partial data D2 is detected, and the management information generating part 124 generates a starting address and a stopping address for distinguishing the storage region P2 of the partial data D2, and changes the flag to "0" to show that the storage region P2 is a programmed region. Thereafter, similarly, when each of the partial data D3 and D4 are inputted, management information therefore are generated.

The data processing part 126 performs scrambling of data and descrambling of data by a random number. Preferably, the data processing part 126 changes the random number for every column address using the column address or the row address of the partial data Di to be programmed as seeds.

Figure 7A:
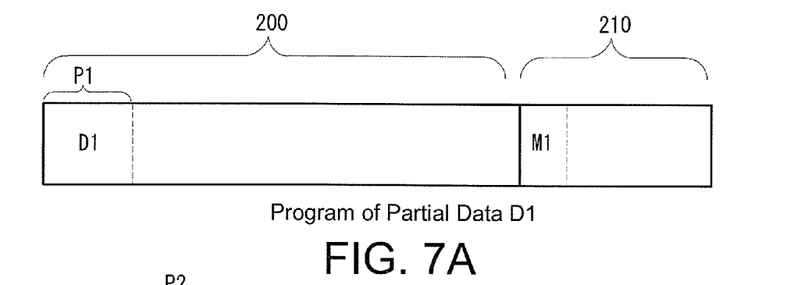
FIG. 7A to FIG. 7E are diagrams showing programming of each partial data when partial page programming is executed according to an embodiment of the invention.
Figure 7B:
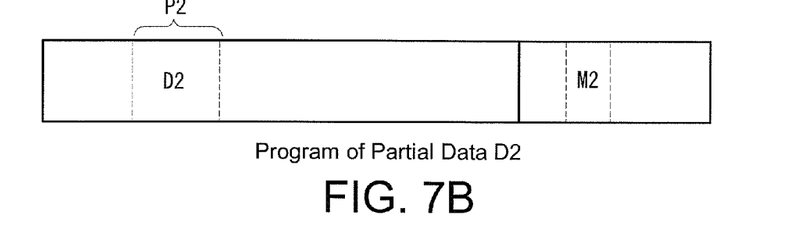
Figure 7C:
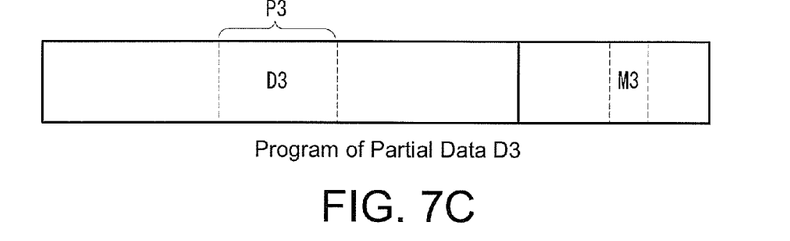
Figure 7D:
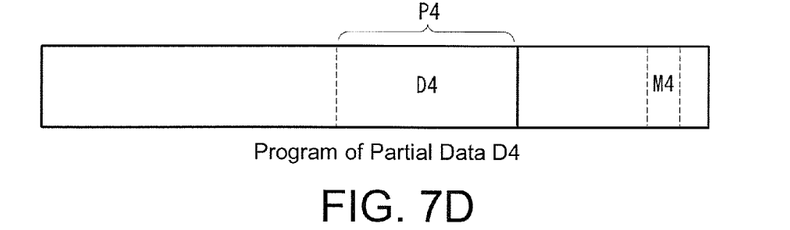

FIG. 7A to FIG. 7E are diagrams showing programming of partial data. Here, the page buffer 170 has a regular region 200 which is used by a user and a redundant region 210 which is not used by the user. The regular region 200 and the redundant region 210 correspond to the regular region and the redundant region of the memory array 100 respectively. As shown in FIG. 7A, when the partial data D1 is inputted, the partial data D1 is scrambled by the data processing part 126, and the transfer/write-in circuit 122 transfers the scrambled data to the storage region P1 of the page buffer. The management information generating part 124 generates the management information related to the partial data D1, and the transfer/write-in circuit 122 writes management information M1 to the redundant region 210. Then, the partial data D1 and the management information M1 which are held in the page buffer 170 are programmed to the selected page of the memory array 100.

Figure 7E:
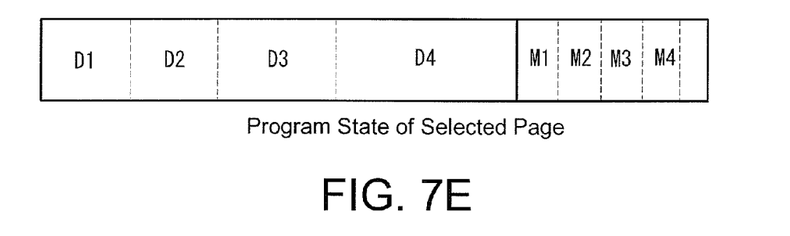

Next, when the row address and the partial data D2 are inputted, the scrambled partial data D2 is transferred to the storage region P2. In addition, the management information M2 related to the partial data D2 is generated and the management information M2 is written-in to the redundant region 210; then, the partial data D2 and the management information M2 are programmed to the same page. The partial data D3 and D4, similarly, are programmed to the selected page according to the inputted row address; eventually, as shown in FIG. 7E, the partial data D1, D2, D3 and D4 and their management information M1, M2, M3 and M4 thereof are programmed to the selected page. In the examples of FIG. 7A to FIG. 7E, the partial data D1, D2, D3 and D4 are coincidently shown to be the same size with the regular region 200, however may also be smaller than the size of the regular region 200.

Figure 8A:
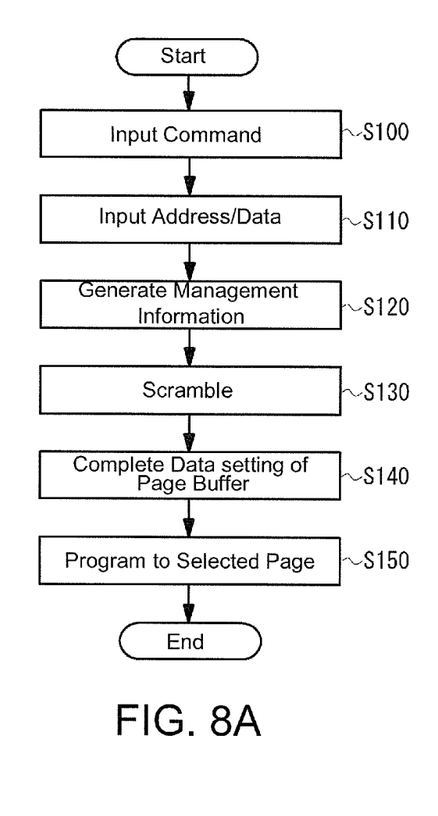
FIG. 8A and FIG. 8B show operation flows of flash memory according to an embodiment of the invention.

Next, a flow of when partial page programming of the flash memory is executed of the present embodiment is shown in FIG. 8A. First, when a programming command from the external controller is received by the control part 150 through the input/output buffer 110, the control part 150 starts controlling the scrambling part 120, the detecting part 130, the word line selecting circuit 160, the page buffer 170 and the row selecting circuit 180 in order to execute the programming sequence (S100). Then, when the address and the partial data are received through the input/output buffer 110 (S110), the management information of the partial data is generated (S120) as shown in FIG. 7A to FIG. 7E, and the scrambling process of the partial data is performed (S130); then the partial data and the management information are set in the page buffer (S140), and the partial data and the management information are programmed to the selected page by the word line selecting circuit 160 (S150). Then, steps S120~S150 are repeated each time partial data and row addresses are inputted.

Figure 8B:
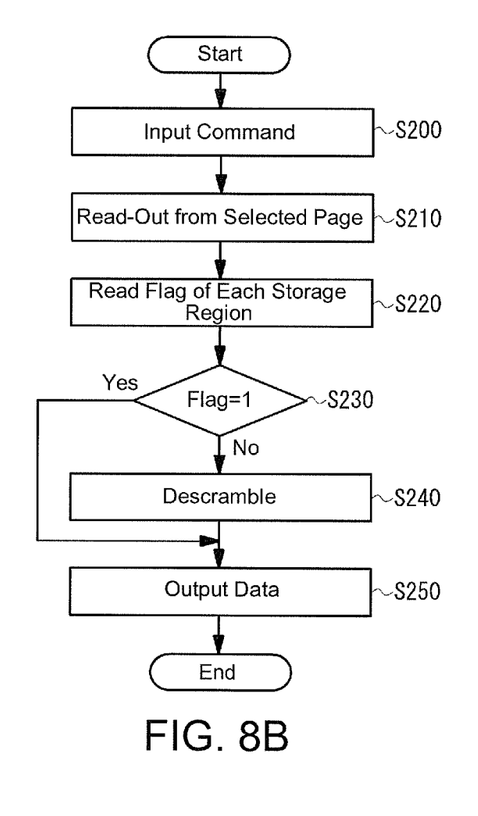

FIG. 8B shows a flow of a data read-out operation. First, when the read-out command from the external controller is received by the control part 150, the control part 150 starts controlling the scrambling part 120, the detecting part 130, the word line selecting circuit 160, the page buffer 170 and the row selecting circuit 180 in order to execute the read-out sequence (S200). Then, when the address is inputted, the word line selecting circuit 160 selects the page according to the address, and the data of the selected page is read-out to the page buffer (S210). The scrambling part 120 reads the flag of each storage region (S220) and determines whether or not to descramble the data of each storage region. That is to say, if the flag is "0", the data of the storage region is descrambled (S240) and if the flag is "1", the scrambling part 120 controls the transfer/write-in circuit 122 and the data processing part 126, such that the data of the storage region is not descrambled. Then, data is outputted from the page buffer to the input/output buffer 110 (S250).

Figure 9:
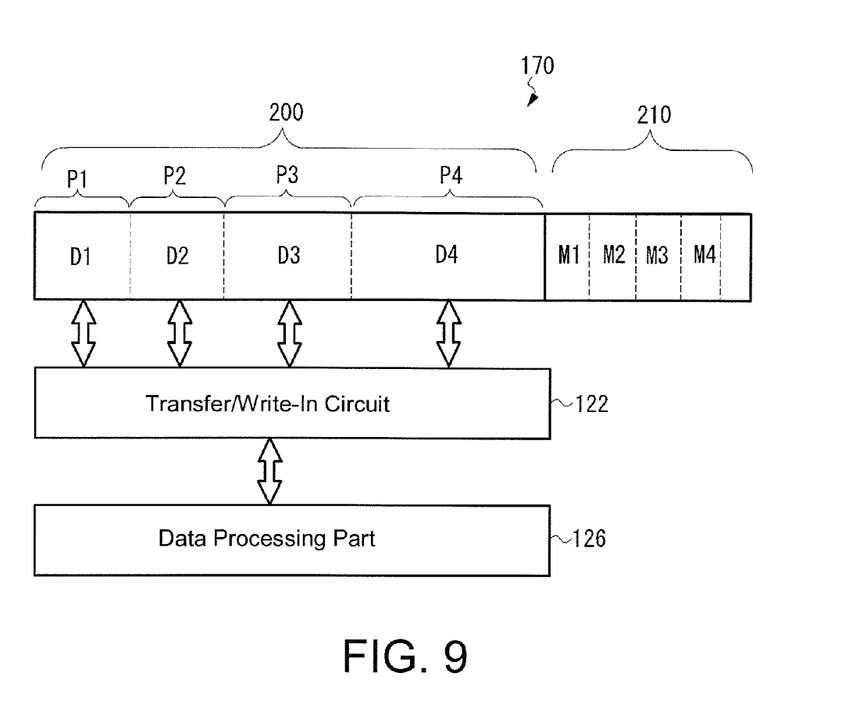
FIG. 9 is a diagram showing an operation when reading-out partial page programming data according to an embodiment of the invention.

FIG. 9 shows a page read-out operation of the partial data shown in FIG. 7E. The data programmed to the selected page is transferred to the page buffer 170. That is to say, the partial data D1~D4 and their corresponding management information M1~M4 are held in the page buffer 170. The scrambling part 120 determines whether the partial data D1~D4 stored in the storage regions P1~P4 are programmed data or erased data according to the management information M1~M4. If the flag is "0", even if the data of all those storage regions are "1", they need to be descrambled since that data is programmed data. If the flag is "1", the descrambling needs to be cancelled since the data of those storage regions are erased data and not programmed.

If the flag is "0", the scrambling part 120 transfers the data in the storage regions defined by the starting address and the ending address to the data processing part 126, and receives the descrambled data there, and rewrites this data to the page buffer 170. If the flag is "1", the data of that storage region is restricted from being transferred to the data processing part 126 and is held to the page buffer 170 directly. For example, if the flags are "0" at the storage regions P1, P2 and P3, and the flag is "1" at the storage region P4, the partial data D1, D2 and D3 of the storage regions P1, P2 and P3 are transferred to the data processing part 126 and are descrambled there. The descrambled partial data D1, D2 and D3 are written-in to the page buffer. On the other hand, the partial data D4 of the storage region P4 is not transferred to the data processing part 126 and is stored directly. In this way, after the processing by the scrambling part 120 is completed, the data held in the page buffer 170 is outputted to the external controller through the input/output buffer 110.

In this way, according to the present embodiment, when partial page programming is executed, the management information of the partial data is generated and it is programmed by associating with the partial data; when data is read-out, the descrambling is controlled with reference to the management information, such that the programmed partial data is descrambled and erased partial data is not descrambled. In this way, both partial page programming and data scrambling are accomplished, and reliability is increased.

In the above mentioned embodiment, for the management information of the partial data, the starting address and the ending address are generated and stored respectively such that the storage region may be identified, however it may be other information as long as it is information which may identify the storage region. It may also be the data size of the partial data. In addition, since only the boundary of the storage region must be identified, only generating and storing the ending address is also acceptable.

Furthermore, in the above mentioned embodiment, although the counter of the detecting part 130 is used to generate the starting address and ending address of the partial data to be programmed, however the ending address and the starting address may be generated using the row address inputted when implementing partial page programming. For example, when programming the partial data of FIG. 7B, the inputted row address Ay2 is the starting address of the partial data D2, and one row address in front of the starting address mat be set to the ending address of the partial data D1. Therefore, when the partial data D2 is programmed, the ending address of the partial data D1 calculated from the row address Ay2 is written-in as the management information M1 of the partial data D1 at the same time. In addition, if needed, the inputted row address Ay2 may be written-in to the management information M2 as the starting address of the partial data D2. Similarly, the ending address of the partial data D2 is calculated from the inputted row address Ay3 when programming the partial data D3, and is written-in to the management information M2 at the same time when programming the partial data D3. The storage region P4 of the last partial data D4 is set to be from the inputted row address Ay4 to the address of the last row of the regular region 200, and the row address Ay4 may be written-in to the management region M4 as the starting address of the storage region P4. By using this type of method, it is possible to easily generate address information showing the boundaries of each storage region without using the counter of the detection part 130.

Furthermore, the detecting part 130 is provided for detecting the data size and input sequence of the partial data, however the address counter included in the row selecting circuit 180 and such may be used to detect the size of the partial data.

Exemplary embodiments of the invention have been described above, however the invention is not limited to the particular embodiments, and various modifications and variations can be made without departing from the scope or spirit of the invention.

What is claimed is:

1. A data processing method for a semiconductor memory device that includes a NAND type memory array having a plurality of memory cells connected in series, the data processing method comprising:
   a generating step, generating identification information and program information when programming data to a same page of the memory array n times consecutively, wherein the identification information identifies a storage region where the data is programmed to the page selected according to inputted address information, and the program information shows whether or not the storage region is a programmed region, and n is a natural number greater than or equal to 2, wherein the selected page comprises a plurality of storage regions;
   a scrambling step, scrambling the data; and
   a programming step, programming the scrambled data, the identification information and the program information to the selected page.

2. The data processing method as claimed in claim 1, wherein the generating step generates the n number of identification information and the n number of program information of storage regions, when the data are programmed to the same page n times consecutively.

3. The data processing method as claimed in claim 1, wherein the programming step programs the scrambled data, the identification information and the program information which are stored in a page buffer to the selected page.

4. The data processing method as claimed in claim 1, wherein the generating step comprises generating the identification information according to a number of times the data is inputted and a size of the data.

5. The data processing method as claimed in claim 1, wherein
   the generating step comprises generating the identification information according to a number of times of the data is inputted and the inputted address information.

6. The data processing method as claimed in claim 1, wherein the identification information comprises an ending address of the storage region when the data is programmed.

7. The data processing method as claimed in claim 1, further comprising:
   a determining step, when data is read-out from the selected page, determining whether the data read-out is programmed data or erased data according to the identification information and the program information.

8. The data processing method as claimed in claim 7, further comprising:
   a descrambling and cancelling descrambling step, descrambling the data when the read-out data is determined to be programmed data and cancelling descrambling of the data when the read-out data is determined to be erased data.

9. The data processing method as claimed in claim 2, wherein the programming step programs the scrambled data, the identification information and the program information which are stored in a page buffer to the selected page.

10. The data processing method as claimed in claim 2, wherein the generating step comprises generating the identification information according to a number of times the data is inputted and a size of the data.

11. The data processing method as claimed in claim 2, wherein the generating step comprises generating the identification information according to a number of times of the data is inputted and the inputted address information.

12. The data processing method as claimed in claim 2, wherein the identification information comprises an ending address of the storage region when the data is programmed.

13. The data processing method as claimed in claim 2, further comprising:
   a determining step, when data is read-out from the selected page, determining whether the data read-out is programmed data or erased data according to the identification information and the program information.

14. The data processing method as claimed in claim 13, further comprising:
   a descrambling and cancelling descrambling step, descrambling the data when the read-out data is determined to be programmed data and cancelling descrambling of the data when the read-out data is determined to be erased data.

15. A semiconductor memory device, comprising:
   a NAND type memory array, formed by a plurality of memory cells connected in series;
   a selecting component, selecting a page of the memory array according to inputted address information;
   a generating component, generating identification information and program information when programming data to the same page of the memory array n times consecutively, wherein the identification information identifies a storage region where the inputted data is programmed to the page selected by the selecting component, and the program information shows whether or not the storage region is a programmed region, and n is a natural number greater than or equal to 2, wherein the selected page comprises a plurality of storage regions;

a scrambling component, scrambling the inputted data to be programmed; and a programming component, programming the scrambled data, the identification information and the program information to the page selected by the selecting component.

16. The semiconductor memory device as claimed in claim 15, wherein the generating component generates the n number of identification information and the n number of program information of storage regions, when the data are programmed to the same page n times consecutively.

17. The semiconductor memory device as claimed in claim 15, further comprising:

a data storage component, storing the data programmed to the selected page of the memory array or the data read-out from the selected page of the memory array, wherein the generating component writes-in the identification information and the program information to the data storage component.

18. The semiconductor memory device as claimed in claim 15, further comprising:

a read-out component, reading out data from the page selected by the selecting component, wherein the read-out component determines whether the data read-out is programmed data or erased data according to the identification information and the program information, and descrambling the data by the scrambling component when the read-out data is determined to be programmed data and cancelling descrambling of the data when the read-out data is determined to be erased data.

19. The semiconductor memory device as claimed in claim 15, wherein the identification information comprises an ending address of the storage region for programming data.

* * * * *